United States Patent
Tominaga et al.

(10) Patent No.: US 11,994,563 B2
(45) Date of Patent: May 28, 2024

(54) BATTERY TYPE DETERMINATION DEVICE AND BATTERY TYPE DETERMINATION METHOD

(71) Applicant: HONDA MOTOR CO., LTD., Tokyo (JP)

(72) Inventors: Yuki Tominaga, Wako (JP); Tsubasa Uchida, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 96 days.

(21) Appl. No.: 17/504,569

(22) Filed: Oct. 19, 2021

(65) Prior Publication Data

US 2022/0128629 A1 Apr. 28, 2022

(30) Foreign Application Priority Data

Oct. 22, 2020 (JP) ................................. 2020-177452

(51) Int. Cl.
- *G01R 31/385* (2019.01)
- *G01R 31/367* (2019.01)
- *H01M 10/42* (2006.01)
- *H02J 7/00* (2006.01)

(52) U.S. Cl.
CPC ......... *G01R 31/386* (2019.01); *G01R 31/367* (2019.01); *H01M 10/4221* (2013.01); *H02J 7/00041* (2020.01)

(58) Field of Classification Search
None
See application file for complete search history.

(56) References Cited

U.S. PATENT DOCUMENTS

2013/0141109 A1 6/2013 Love et al.
2013/0285616 A1* 10/2013 Washiro ................ H01M 10/48
429/61

FOREIGN PATENT DOCUMENTS

| JP | 2004-215398 | 7/2004 |
|----|-------------|--------|
| JP | 2009-510697 | 3/2009 |
| JP | 2011-514129 | 4/2011 |
| JP | 2014-102111 | 6/2014 |
| JP | 2020-169932 | 10/2020 |
| WO | 2007/038585 | 4/2007 |

(Continued)

OTHER PUBLICATIONS

Japanese Office Action for Japanese Patent Application No. 2020-177452 dated Mar. 15, 2022.

*Primary Examiner* — Roy Y Yi
(74) *Attorney, Agent, or Firm* — Amin, Turocy & Watson, LLP

(57) ABSTRACT

A battery type determination device according to an embodiment includes: an output controller configured to instruct a current application circuit to apply a specific current to a target battery; a voltage response measurer configured to measure a voltage response of the target battery with respect to the current applied using the output controller; a calculator configured to obtain an inductance value of the target battery on the basis of a current value applied using the output controller and a voltage value measured by the voltage response measurer; and a determiner configured to determine a type of the target battery on the basis of a specified value of an inductance according to the type of the target battery and an inductance value of the target battery obtained using the calculator.

6 Claims, 7 Drawing Sheets

(56) References Cited

FOREIGN PATENT DOCUMENTS

WO 2009/105595 8/2009
WO 2015/133068 9/2015

* cited by examiner

FIG. 5

| BATTERY ID | BATTERY TYPE | | | L COMPONENT SPECIFIED VALUE |
| --- | --- | --- | --- | --- |
| | FIRST TYPE (VEHICLE TYPE) | SECOND TYPE (GENUINE/NON-GENUINE) | THIRD TYPE (MANUFACTURER) | |
| B001 | A | GENUINE | — | ... |
| B002 | B | GENUINE | — | ... |
| B101 | — | NON-GENUINE | PRODUCED BY AAA | ... |
| B102 | — | NON-GENUINE | PRODUCED BY BBB | ... |
| ... | ... | ... | ... | ... |

T1

BATTERY TYPE DETERMINATION DEVICE AND BATTERY TYPE DETERMINATION METHOD

CROSS-REFERENCE TO RELATED APPLICATION

This application is based upon and claims the benefit of priority from Japanese Patent Application No. 2020-177452, filed Oct. 22, 2020, the entire contents of which is incorporated herein by reference.

BACKGROUND

Field of the Invention

The present invention relates to a battery type determination device and a battery type determination method.

Description of Related Art

In the related art, a method for identifying a type of battery on the basis of a direct current (DC) internal resistance when a battery is charged and a DC internal resistance when a battery is discharged is known (refer to PCT International Publication No. WO 2015/133068). In such a method, a resistor having a predetermined resistance value is attached to a battery and a type of the battery is determined by measuring the resistance value at the time of identification. Furthermore, there is also a method in which an IC chip is attached to a battery and a type of the battery is determined on the basis of an identification signal output by the IC chip.

SUMMARY

However, in the related art, it is necessary to attach a component such as a resistor and an IC chip to a battery, which is costly. Furthermore, if these components are imitated, the components may be attached to a battery not as intended and a type of battery may not be correctly identified.

The present invention was made in consideration of such circumstances, and an object of the present invention is to determine a type of battery without attaching an identification component.

A battery type determination device and a battery type determination method according to the present invention employ the following constitutions.

(1) A first aspect of the present invention is a battery type determination device including: an output controller configured to instruct a current application circuit to apply a specific current to a target battery; a voltage response measurer configured to measure a voltage response of the target battery with respect to the current applied using the output controller, a calculator configured to obtain an inductance value of the target battery on the basis of a current value applied using the output controller and a voltage value measured by the voltage response measurer; and a determiner configured to determine a type of the target battery on the basis of a specified value of an inductance according to the type of the target battery and an inductance value of the target battery obtained using the calculator.

(2) In a second aspect of the present invention, in the first aspect, the determiner determines whether the target battery is a battery of a type designated in advance on the basis of a specified value of an inductance of a battery of the designated type and the inductance value of the target battery obtained using the calculator.

(3) In a third aspect of the present invention, in the first or second aspect, the target battery has a winding body of electrodes and separators.

(4) In a fourth aspect of the present invention, in the third aspect, the target battery includes a plurality of cells having the winding body and terminals of the cells, and the inductance value changes in accordance with a shape of the electrodes or a shape of the terminals.

(5) In a fifth aspect of the present invention, in the third aspect, the target battery includes bus bars which connect terminals of a plurality of cells having the winding body, and the inductance value changes in accordance with a shape of the bus bars.

(6) A sixth aspect of the present invention is a battery type determination method which causes: a battery type determination device, to instruct a current application circuit to apply a specific current to a target battery; to measure a voltage response of the target battery with respect to the applied current; to obtain an inductance value of the target battery on the basis of a current value applied to the target battery and a voltage value measured as the voltage response; and to determine a type of the target battery on the basis of a specified value of an inductance according to the type of the target battery and the obtained inductance value of the target battery.

According to the above aspect, the battery type determination device can instruct the current application circuit to apply a specific current to a target battery, measure a voltage response of the target battery with respect to the applied current, obtain an inductance value of the target battery on the basis of a current value applied to the target battery and a voltage value measured as the voltage response, and determine a type of the target battery on the basis of a specified value of an inductance according to a type of the target battery and the obtained inductance value of the target battery to determine a type of battery without attaching an identification component.

BRIEF DESCRIPTION OF THE DRAWINGS

FIG. 5 is a diagram showing an example of correspondence information in a battery type determination device in an embodiment.

DESCRIPTION OF EMBODIMENTS

Embodiments of a battery type determination device and a battery type determination method of the present invention will be described below with reference to the drawings.

Figure 1:
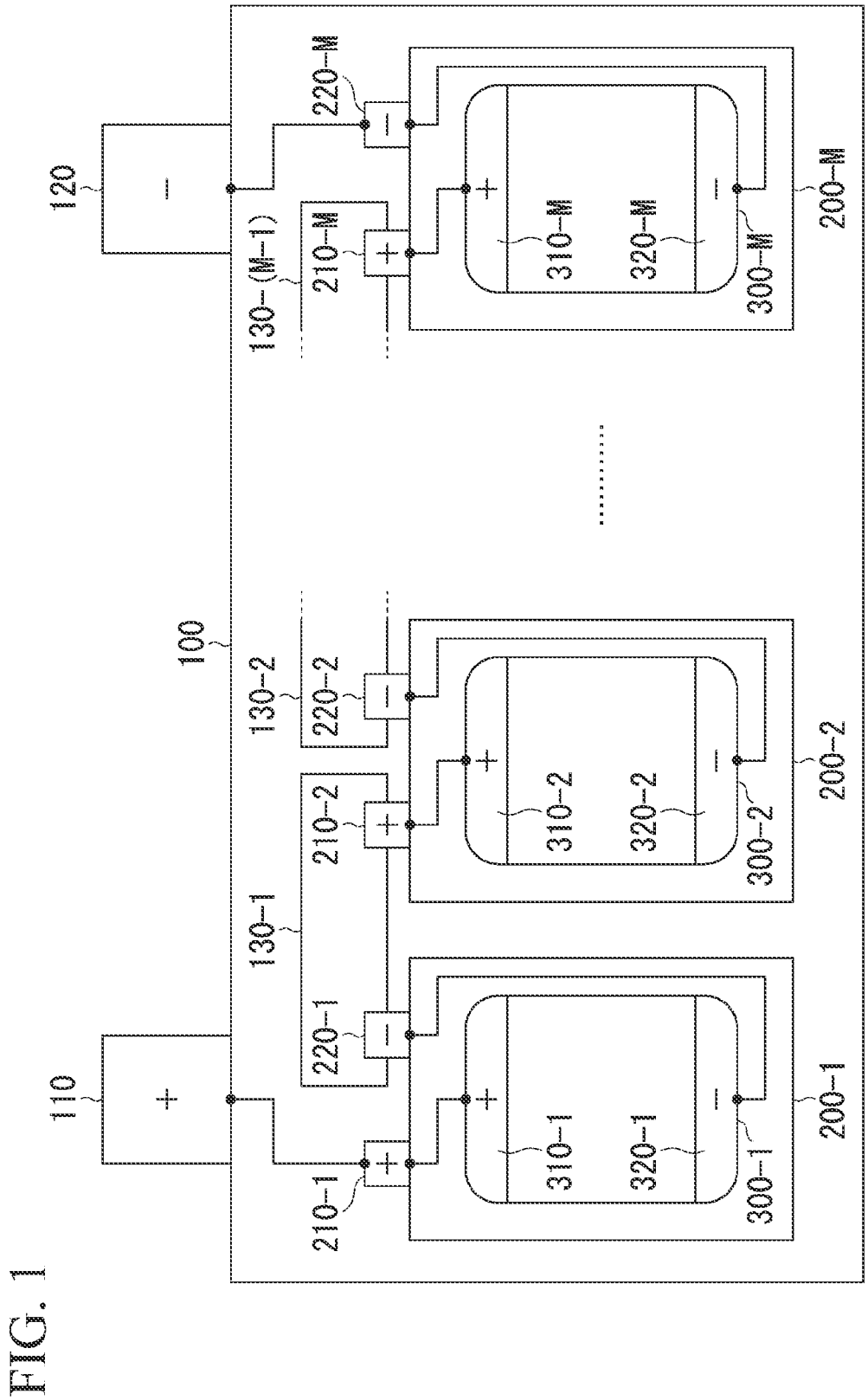
FIG. 1 is a diagram showing an example of a battery in an embodiment.
Figure 2:
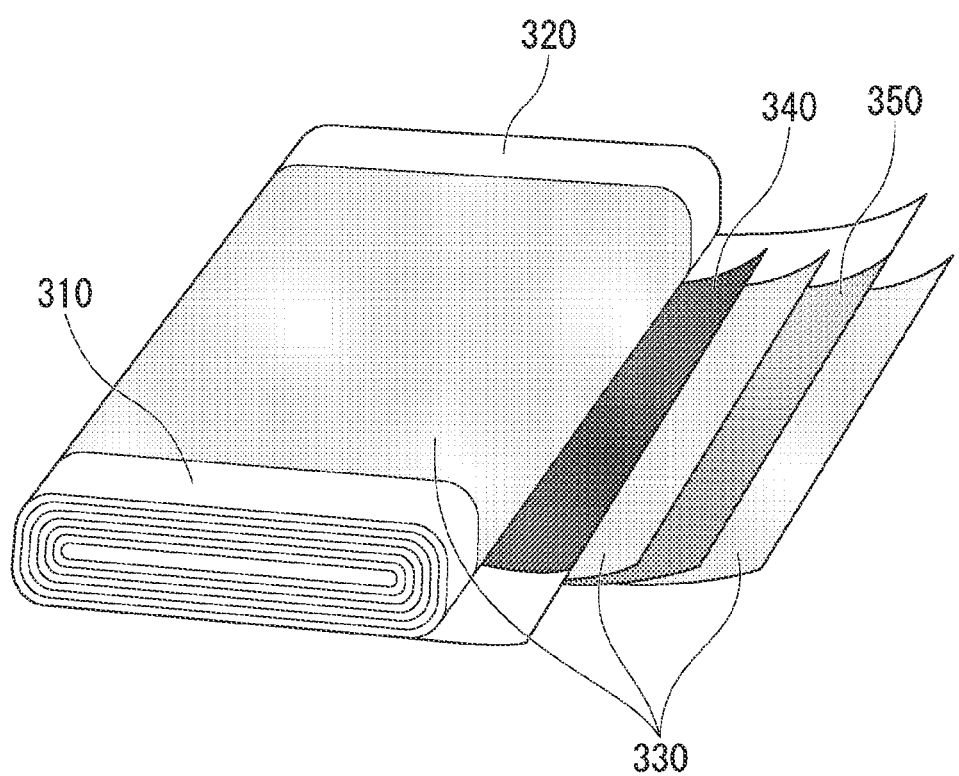
FIG. 2 is a diagram showing an example of the battery in the embodiment.

FIGS. 1 and 2 are diagrams showing an example of a battery in an embodiment. FIG. 1 shows an outline of a constitution of a battery and FIG. 2 shows an outline of a battery mechanism of each cell constituting the battery. A battery 100 shown in FIG. 2 is constituted by connecting a plurality of cells 200 in series. The battery 100 includes a positive electrode terminal 110, a negative electrode terminal 120, one or more bus bars 130, and a plurality of cells 200. FIG. 2 shows cells 200-1 to 200-M as an example of the plurality of cells 200. M is an integer greater than or equal to 1.

Each of the cells 200 includes winding electrode bodies 300 (winding bodies) and an electrolytic solution (not shown) provided therein, a positive electrode terminal 210, and a negative electrode terminal 220. A positive electrode terminal 210-1 of a cell 200-1 is connected to the positive electrode terminal 110 of the battery 100 and a negative electrode terminal 210-M of a cell 200-M is connected to the negative electrode terminal 120 of the battery 100. Furthermore, a positive electrode terminal 210-$i$ of a cell 200-$i$ (2≤i≤M) is connected to a negative electrode 220-$j$ of a cell 200-$j$ (j=i−1) through a bus bar 130-$j$ (j=i−1). On the other hand, a negative electrode terminal 220-$k$ of a cell 200-$k$ (1≤k≤M−1) is connected to a positive electrode terminal 210-1 of a cell 200-1 (l=k+1) through a bus bar 130-$k$.

Each of the winding electrode bodies 300 includes a positive electrode tab 310, a negative electrode tab 320, a separator 330, a positive electrode 340, and a negative electrode 350. The separator 330 is a member which isolates the positive electrode 340 and the negative electrode 350, holds the electrolytic solution, and secures ionic conductivity between the positive electrode 340 and the negative electrode 350. The winding electrode body 300 is constituted by laminating the positive electrode tab 310, the negative electrode tab 320, the separator 330, the positive electrode 340, and the negative electrode 350 in the order shown in FIG. 2 and winding them.

Figure 3:
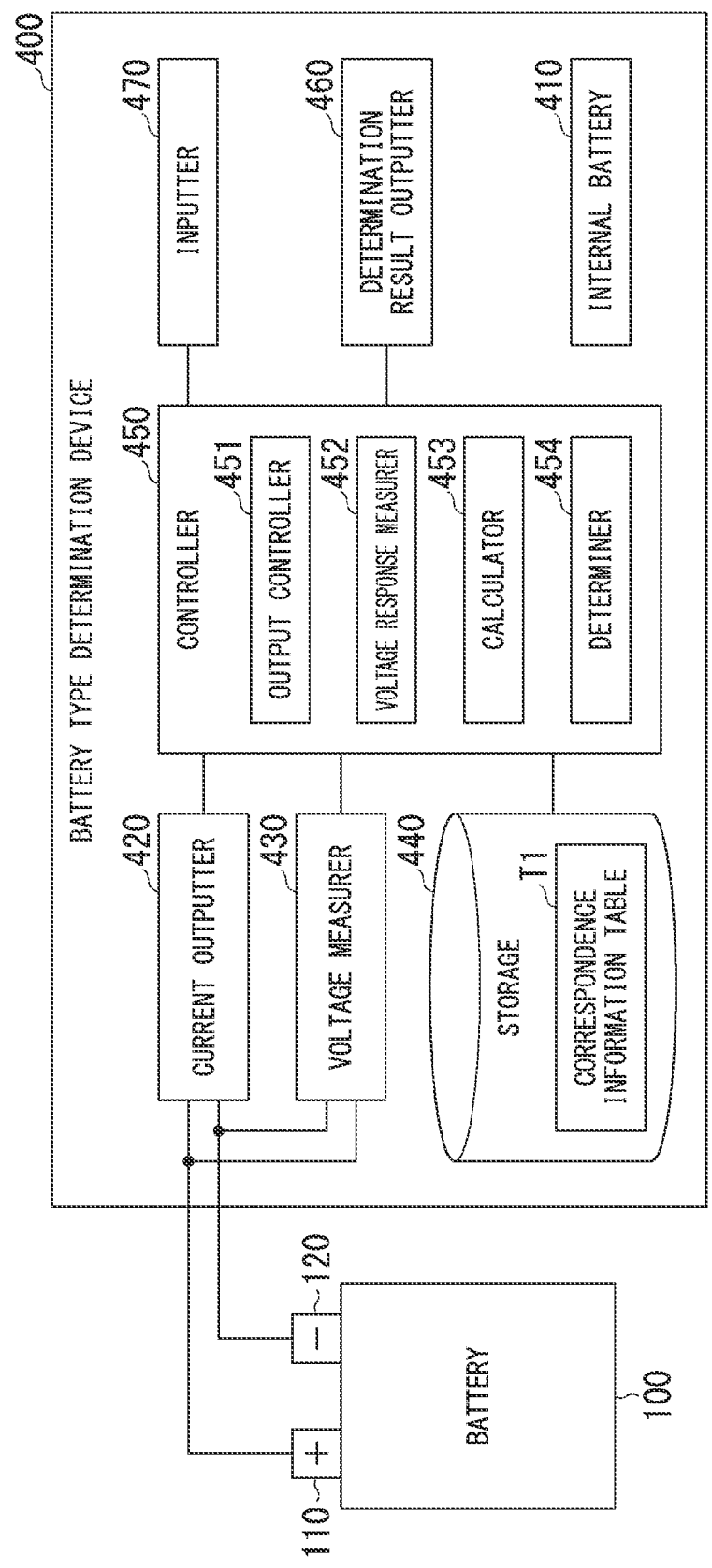
FIG. 3 is a diagram showing an example of a constitution of a battery type determination device in the embodiment.

FIG. 3 is a diagram showing an example of a constitution of a battery type determination device 400 in the embodiment. The battery type determination device 400 includes an internal battery 410, a current outputter 420, a voltage measurer 430, a storage 440, a controller 450, a determination result outputter 460, and an inputter 470. The controller 450 is realized using, for example, a program (software) executed by a hardware processor such as a central processing unit (CPU). Some or all of these constituent elements may be realized using hardware (circuit unit; including a circuitry) such as a large scale integration (LSI), an application specific integrated circuit (ASIC), a field-programmable gate array (FPGA), and a graphics processing unit (GPU) or realized in cooperation of software and hardware. A program may be stored in advance in a storage device (a storage device including a non-transient storage medium) such as a hard disk drive (HDD) and a flash memory, or stored in a removable storage medium (non-transient storage medium) such as a DVD and a CD-ROM, and installed when such a storage medium is installed in a drive device.

The internal battery 410 is a battery which supplies electric power required for an operation of the battery type determination device 400. Each functional unit of the battery type determination device 400 can be operated using electric power supplied by the internal battery 410. The internal battery 410 may a battery or an interface which obtains electric power from other power sources. In the following description, in order to distinguish the battery 100 which is a target whose battery type is to be determined from the internal battery 410 which supplies electric power required for an operation of the battery type determination device 400 described above, the battery 100 may be referred to as a "target battery" in some cases.

The current outputter 420 is a current application circuit controlled so that the current application circuit applies a specific current to the target battery 100. The current outputter 420 applies a current of an intensity instructed by the controller 450 to the target battery 100. A current output by the current outputter 420 is applied to the battery 100 via a probe P.

The voltage measurer 430 is a voltage measuring circuit which measures an output voltage of the target battery 100. The voltage measurer 430 outputs a measurement value of the output voltage of the target battery 100 to the controller 450. A timing at which the voltage measurer 430 measures the output voltage of the target battery 100 is controlled by the controller 450.

The storage 440 is constituted using, for example, a magnetic storage device such as a hard disk drive (HDD) or a semiconductor storage device such as a solid state drive (SSD). The storage 440 stores various information regarding an operation of the battery type determination device 400. For example, the storage 440 stores measurement data of the output voltage of the target battery 100, information indicating the determination results of the battery type, setting information of a current applied to the target battery 100, various program data for realizing the controller 450, and the like. Furthermore, the storage 440 stores correspondence information which will be described in advance.

The controller 450 controls each functional unit of the battery type determination device 400 so that the battery type determination device 400 can determine a battery type of the target battery 100. To be specific, the controller 450 includes an output controller 451, a voltage response measurer 452, a calculator 453, and a determiner 454.

The output controller 451 has a function of applying a specific current for the purpose of identifying a battery type (hereinafter referred to as an "identification current") to the target battery 100 by controlling an output intensity of the current outputter 420. For example, the output controller 451 can apply an alternating current which changes in a sinusoidal shape to the target battery 100 by continuously changing the output intensity of the current outputter 420. Furthermore, the output controller 451 can also output and apply a direct current (DC) current which changes in a rectangular wave shape to the target battery 100 by changing the output intensity of the current outputter 420 at a prescribed timing.

The output controller 451 may be constituted to detect that the target battery 100 is connected to the battery type determination device 400 and start applying an identification current to the target battery 100. Furthermore, when the battery type determination device 400 includes an input device such as a mouse or a keyboard, the output controller 451 may be constituted to start applying an identification current to the target battery 100 in response to a user's input operation.

The voltage response measurer 452 has a function of measuring an output voltage of the target battery 100 when an identification current is applied. That is to say, the voltage response measurer 452 has a function of measuring a response of the output voltage of the target battery 100 with respect to an application of the identification current. To be specific, the voltage response measurer 452 acquires measurement data after a timing at which the application of the identification current to the target battery 100 is started among measurement values of the output voltage of the target battery 100 output from the voltage measurer 430 and outputs the measurement data to the calculator 453.

The calculator 453 calculates a value indicating the electrical characteristics of the target battery 100 (hereinafter referred to as an "electrical characteristic value") on the basis of the measurement data of the voltage response of the target battery 100 with respect to the application of the identification current. In the embodiment, the calculator 453 calculates an L component (inductance) of an impedance of the target battery 100 as an electrical characteristic value. The impedance of a battery represents the frequency dependence of an internal resistance of the battery. Generally, it is known that an L component of an impedance of a battery depends on shapes of constituent elements of the battery and does not increase in relation to a temperature of the battery, a state of charge (SOC; charging rate), a deterioration state, and the like. For example, it is known that an L component changes in accordance with shapes of electrodes and terminals included in a battery. Furthermore, for example, it is known that an L component changes in accordance with a shape of a bus bar connecting terminals of a plurality of cells included in a battery. Particularly, it is known that, when a battery includes a winding electrode body, an L component of an impedance of the battery significantly depends on a shape of the winding electrode body.

Since a time constant of the L component of the impedance of the battery is about 1 kHz divided by an arbitrary number, the measurement does not require a long time. For this reason, in the embodiment, a voltage response of the target battery 100 is observed when an identification current which changes in a frequency band of about 5 kHz to 1 kHz which contributes to the appearance of the L component of the impedance is applied to the target battery 100.

Figure 4A:
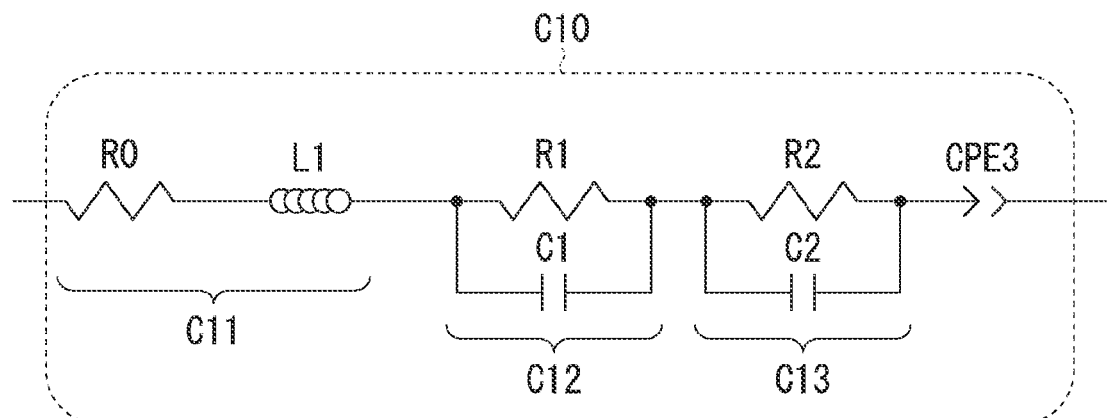
FIG. 4A is a circuit diagram for explaining an example of electrical characteristics of a target battery.
Figure 4B:
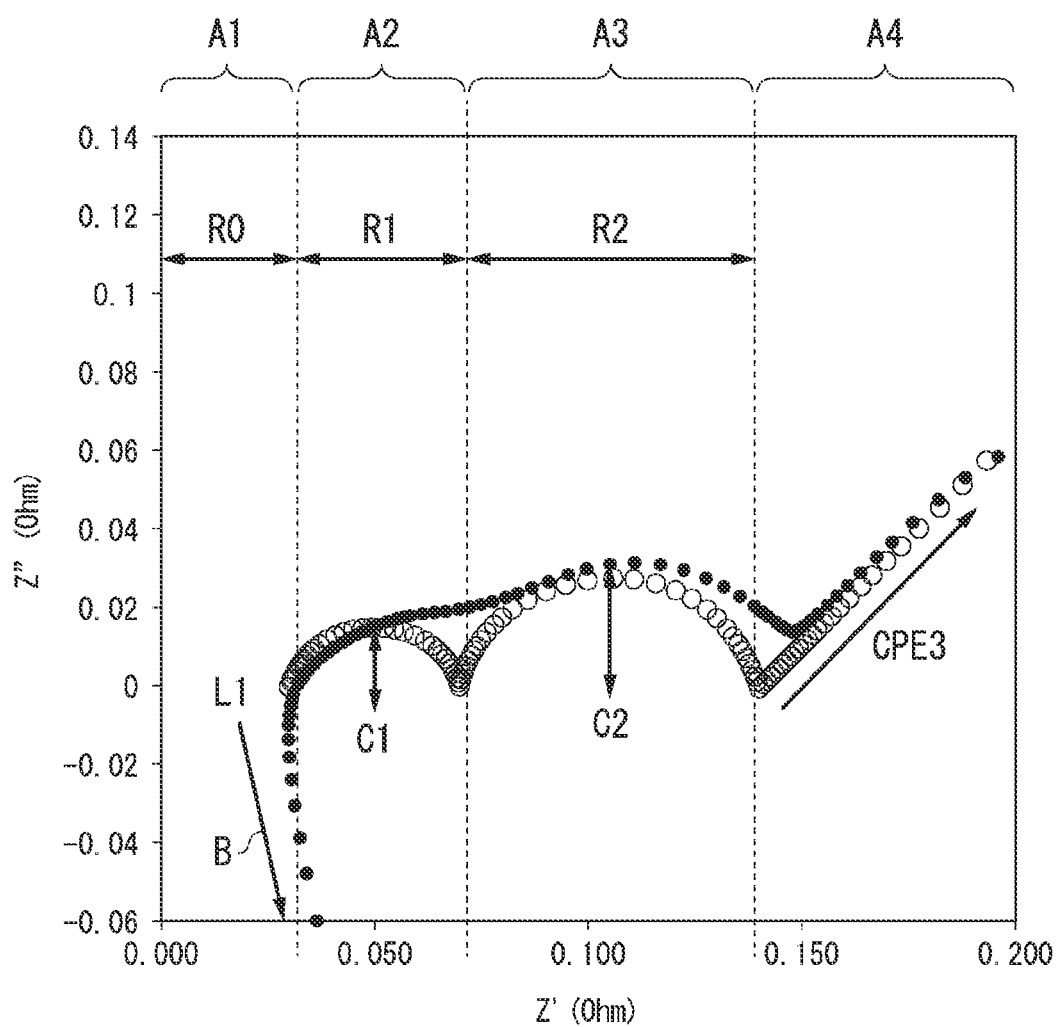
FIG. 4B is a Cole-Cole plot diagram showing of an example of the electrical characteristics of the target battery.

For example, the characteristics of a voltage response with respect to an application current of a circuit C10 including a resistor (R), a coil (L), and a capacitor (C) exemplified in FIG. 4A are represented by the Cole-Cole plot shown in FIG. 4B. As shown in FIG. 4A, the circuit C10 is a circuit constituted of a first circuit C11 including a resistor R0 and a coil L1, a second circuit C12 including a resistor R1 and a capacitor C1, a third circuit C13 including a resistor R2 and a capacitor C2, and a constant phase element (CPE) 3 which are connected in series.

In the Cole-Cole plot of FIG. 4B, conceptually, a plot in a first region A1 shows the response characteristics of the first circuit C11, a plot in a second region A2 shows the response characteristics of the second circuit C12, a plot in a third region A3 shows the response characteristics of the third circuit C13, and a plot in a fourth region A4 shows the response characteristics of the CPE 3. Here, the L component of the impedance which is one of the response characteristics of the circuit C10 appears as a height of a plot (a length in a vertical axis direction) at the boundary between the first region A1 and the second region A2. For example, in the example of FIG. 4B, a length of the arrow B1 in the drawing represents a size of the L component.

The calculator 453 calculates the L component of the impedance by creating the above-described Cole-Cole plot on the basis of the measurement data of the voltage response acquired for the target battery 100 and outputs the calculated value of the L component to the determiner 454.

The determiner 454 determines a battery type of the target battery 100 on the basis of the electrical characteristic value acquired for the target battery 100. To be specific, the determiner 454 determines a battery type of the target battery 100 on the basis of the correspondence information in which the type of the battery and the specified value of the L component of the impedance of each type of battery are associated with each other. It is assumed that the corresponding information is stored in the storage 440 in advance. The determiner 454 outputs information indicating the result of the battery type determination performed on the target battery 100 (hereinafter referred to as "determination result information") to the determination result outputter 460.

The determination result outputter 460 outputs the determination result information output from the determiner 454 in a prescribed form. For example, the determination result outputter 460 may include display devices such as a liquid crystal display and an organic electro-luminescence (EL) display and display the determination result information on these display devices. Furthermore, for example, the determination result outputter 460 may include a wired or wireless communication interface and the determination result information may be transmitted to another communication device via these communication interfaces. In addition, the determination result outputter 460 may include a voice output device such as a speaker and output vocal sound indicating the details of the determination result information using the voice output device.

The inputter 470 has a function of inputting information regarding an operation of the battery type determination device 400. For example, the inputter 470 may include input devices such as a mouse and a keyboard and may be constituted to input required information via these input devices. Furthermore, the inputter 470 may include wired or wireless communication interfaces and may be constituted to input required information via these communication interfaces. The inputter 470 outputs the input information to the controller 450.

FIG. 5 is a diagram showing an example of correspondence information in the battery type determination device 400 in the embodiment. For example, the correspondence information is stored in the storage 440 in the form of a correspondence information table T1 shown in FIG. 5. For example, the correspondence information table T1 is a table having one or more records having each of values of a battery ID, a battery type, and an L component specified value. The battery ID is identification information of a battery. The battery type represents a type of battery. The battery type may be one type or a plurality of types. The L component specified value represents a specified value of the L component of the impedance or a range of the specified value for the corresponding battery. The L component specified value corresponds to a determination condition at the time of determining the battery type of a battery to be determined.

In the example of FIG. 5, the battery type is indicated by three types such as a first type, a second type, and a third type. For example, the first type indicates a type of vehicle having a corresponding battery installed therein. The second type indicates whether a corresponding battery is a genuine battery produced by a manufacturer of a vehicle of a corresponding vehicle type. The third type indicates a manufacturer of a corresponding battery. For example, the example of FIG. 5 shows that a battery identified using a battery ID of B001 is a genuine battery installed in a vehicle of a vehicle type A. Furthermore, for example, the example of FIG. 5 shows that a battery identified using a battery ID of B101 is a non-genuine battery produced by AAA.

Figure 6:
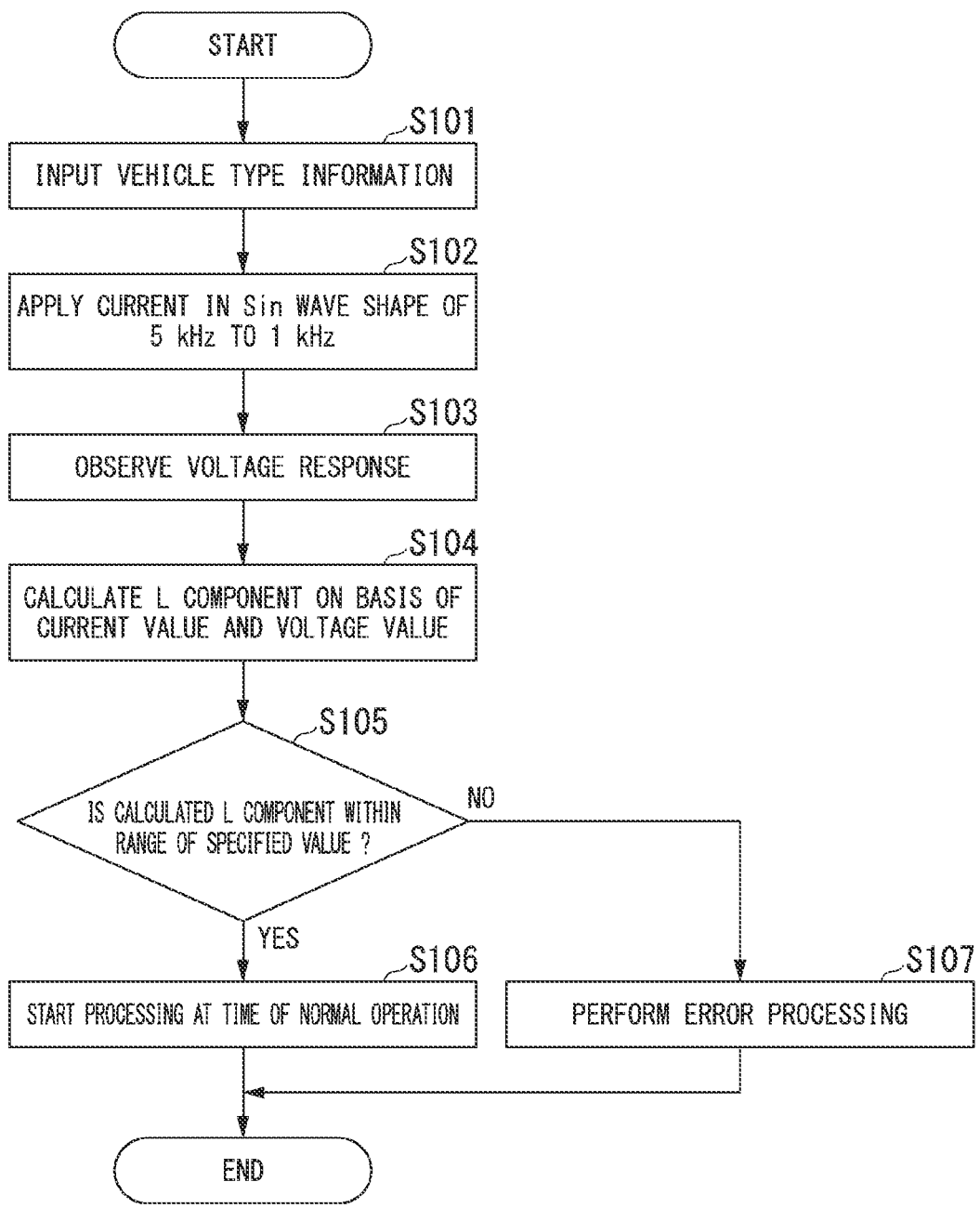
FIG. 6 is a flowchart for describing an example of a process in which the battery type determination device in the embodiment determines a battery type of a target battery.

FIG. 6 is a flowchart for describing an example of a process in which the battery type determination device 400 in the embodiment determines a battery type of the target battery 100. Here, at the start of the flowchart, it is assumed that the battery type determination device 400 is connected to the target battery 100 to be determined. First, in the battery type determination device 400, the inputter 470 inputs vehicle type information (Step S101). The vehicle type information is information indicating a vehicle type of a vehicle having the target battery 100 installed therein. The vehicle type information may be input through a user's operation or may be acquired from another communication device. The inputter 470 outputs the input vehicle type information to the controller 450.

Subsequently, the output controller 451 controls the current outputter 420 and applies an identification current to the target battery 100. For example, the output controller 451 applies a sinusoidal-shaped AC current which changes in a cycle of about 5 kHz to 1 kHz to the target battery 100 as an identification current (Step S102).

Subsequently, the voltage response measurer 452 measures an output voltage of the target battery 100 at the time of applying the identification current (Step S103). To be specific, the voltage response measurer 452 acquires measurement data after a timing at which the application of the identification current to the target battery 100 is started among the measurement values of the output voltage of the target battery 100 output from the voltage measurer 430. The voltage response measurer 452 outputs the acquired measurement data to the calculator 453.

Subsequently, the calculator 453 acquires an electrical characteristic value of the target battery 100 through calculation using the measurement data of the voltage response of the target battery 100 which is output from the voltage response measurer 452. To be specific, the calculator 453 calculates the value of the L component of the impedance of the target battery 100 as an electrical characteristic value (Step S104). For example, the L component of the impedance in this case can be obtained through the following Expressions (1) and (2).

[Expression. 1]

$$jR(\omega) = j\omega L \quad (1)$$

[Expression. 2]

$$\omega = 2\pi f \quad (2)$$

In Expression (1), f represents a frequency of alternating current (AC) and $\omega$ represents an angular frequency thereof. Furthermore, $R(\omega)$ represents a resistance value and is obtained through the Ohm's law using a current value and a voltage value. In addition, in Expression (1), j represents an imaginary unit and L represents an L component of an impedance. The calculator 453 notifies the determiner 454 of the calculated value of the L component of the impedance (hereinafter referred to as an "L component measurement value").

Subsequently, the determiner 454 determines whether the target battery 100 is a legitimate battery on the basis of the L component measurement value having a notification provided from the calculator 453. To be specific, the determiner 454 refers to the correspondence information table T1 and selects a record having a vehicle type of a vehicle having the target battery 100 installed therein as a value of the first type. Subsequently, the determiner 454 compares the value of the L component specified value of the selected record with the L component measurement value and determines whether the L component measurement value is within a range of the specified value (Step S105).

For example, when the L component of the impedance of the target battery is on the order of $10^{-7}$, a specified value can be set for correspondence information within an allowable range of about ±30%. Furthermore, for example, when the L component of the impedance of the target battery is on the order of $10^{-8}$, a specified value can be set for corresponding information within an allowable range of about ±100%.

Here, when it is determined that the L component measurement value is within a range of a specified value, the determiner 454 performs processing at the time of a normal operation in consideration of the fact that the target battery 100 is a legitimate battery (for example, a genuine product) (Step S106). On the other hand, when it is determined in Step S105 that the L component measurement value is not within a range of a specified value, the determiner 454 performs processing at the time of an abnormal operation in consideration of the fact that the target battery 100 is a legitimate battery (for example, a non-genuine product) (Step S107).

The processing at the time of a normal operation described herein may be any processing as long as it needs to be performed when the target battery 100 is a legitimate battery. Similarly, the processing at the time of an abnormal operation described herein may be any processing as long as it needs to be performed when the target battery 100 is not a legitimate battery. For example, the determiner 454 may perform a process for exerting the original performance as processing at the time of a normal operation for a control system of the vehicle having the target battery 100 installed therein and perform a process for limiting the performance that the vehicle can exert as processing at the time of an abnormal operation. With such control, it is possible to prevent the vehicle from being endangered before emergency happens by limiting the performance that the vehicle can exert when a non-genuine battery is utilized in a vehicle produced by a subject manufacturer.

Also, for example, the determiner 454 may perform, as processing at the time of a normal operation, processing of maintaining the warranty of the vehicle and perform, as processing at the time of an abnormal operation, processing of stopping the warranty of the vehicle on a system which manages the warranty of the vehicle having the target battery 100 installed therein. With such control, it is possible to prevent an unreasonable cost from being imposed on the manufacturer of the vehicle by guaranteeing an accident or the like which occurs in a vehicle which does not utilize a genuine battery.

Furthermore, for example, the determiner 454 may perform, as processing at the time of a normal operation, processing of including vehicle data of the vehicle having the target battery 100 installed therein in a target of statistical processing and perform, as processing at the time of an abnormal operation, processing of excluding vehicle data from the target of statistical processing on a system which analyzes vehicle data collected by telematics and provides various services. With such control, it is possible to prevent the reliability of statistical processing from deteriorating and the quality of service provision from deteriorating due to vehicle data of a vehicle which does not utilize a genuine battery.

Such determination of the battery type and processing at the time of a normal operation or processing at the time of an abnormal operation according to the determination result may be performed at the time of inspection of the vehicle having the target battery 100 installed therein, at the time of starting up the vehicle having the target battery 100 installed therein, and the like.

Figure 7:
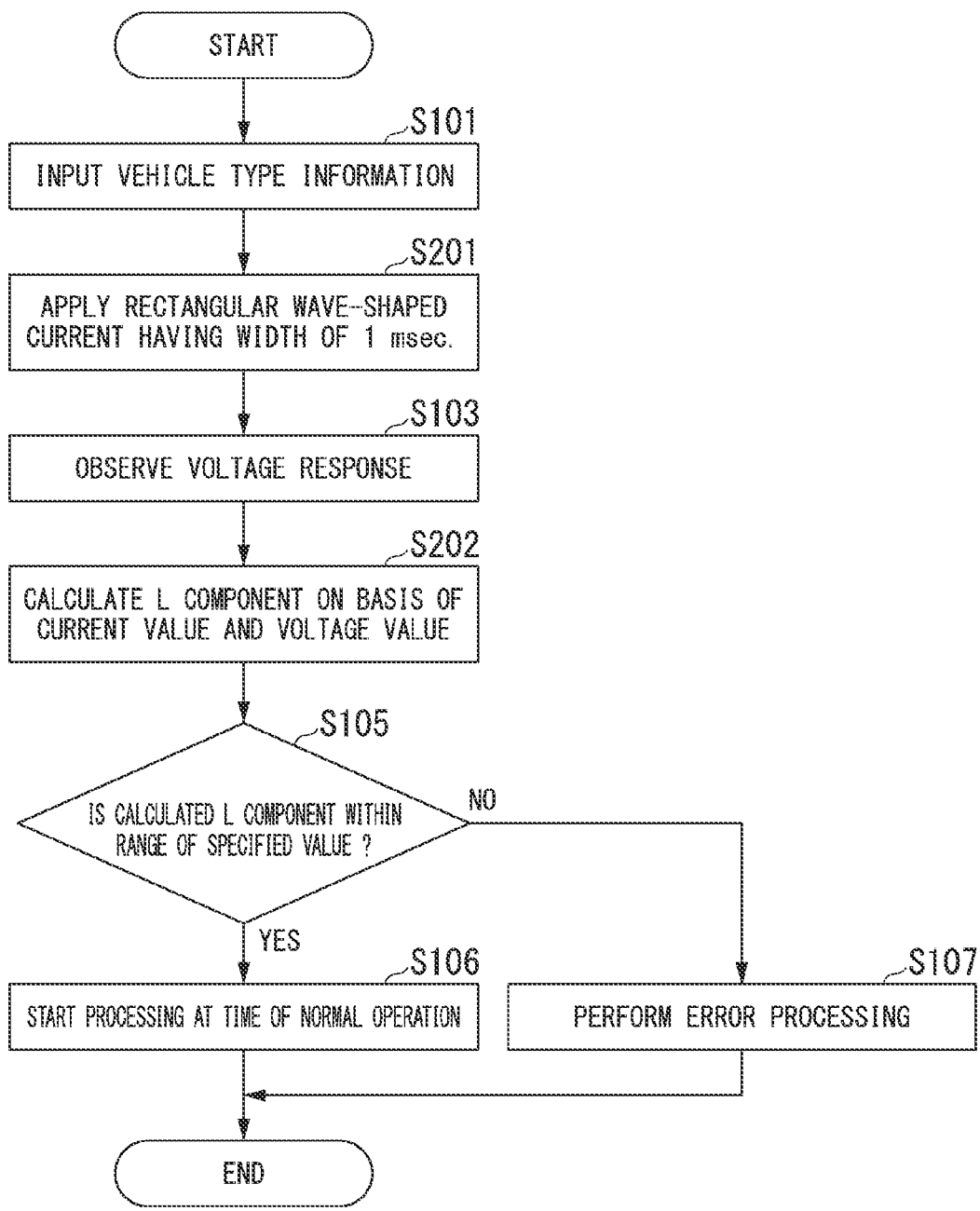
FIG. 7 is a flowchart for describing an example of a process in which the battery type determination device in the embodiment determines a battery type of a target battery.

FIG. 7 is a flowchart for describing an example of a process in which the battery type determination device 400 in the embodiment determines a battery type of the target battery 100. Here, as in the case of FIG. 6, at the start of the flowchart, it is assumed that the battery type determination device 400 is connected to the target battery 100 to be determined. Furthermore, in FIG. 7, the same processes as in FIG. 6 are denoted by the same reference numerals as those in FIG. 6 and the description of these same processes will be omitted.

Subsequent to Step S101, the output controller 451 controls the current outputter 420 to apply an identification current to the target battery 100. For example, the output controller 451 applies a rectangular wave-shaped current having a width of 1 msec to the target battery 100 as an identification current (Step S201).

Subsequent to Step S103, the calculator 453 acquires an electrical characteristic value of the target battery 100 through calculation using the measurement data of the voltage response of the target battery 100 which is output from the voltage response measurer 452. To be specific, the calculator 453 calculates a value of the L component of the impedance of the target battery 100 as the electrical characteristic value (Step S202). For example, the L component of the impedance in this case can be obtained through the following Expression (3).

[Expression. 3]

$$v(t)=R0+L*dI/dt \quad (3)$$

In Expression (3), v(t) represents a voltage value at time t and R0 represents a resistance value of a resistor R0. Furthermore, L represents a L component of an impedance and I represents a current value. According to Expression (3), in principle, although an L component of an impedance can be obtained as a fixed value, a transient response of a voltage generated due to an L component is a very high frequency. Thus, an L component of an impedance can be calculated as fixed value as long as a voltage response can be measured at an ideal high frequency. However, actually, it is assumed that the L component is affected by the measurement noise and does not necessarily have a fixed value. In this case, since the L component can be calculated as a discrete value which fluctuates depending on a sampling timing, the calculator 453 may estimate the L component from, for example, a plurality of measurement data groups.

The battery type determination device 400 in the embodiment constituted in this way can apply a specific current to the target battery 100 and determine a type of the target battery on the basis of the electrical characteristic value observed as a response. For this reason, according to the battery type determination device 400 in the embodiment, it is possible to determine the type of the target battery 100 without attaching the identification component.

Although a case in which the battery type determination device 400 performs a determination concerning whether the target battery 100 is a legitimate battery on the basis of the vehicle type designated in advance and the L component measurement value has been described in the above-described embodiments, the battery type determination device 400 may be constituted to identify other attributes of the target battery 100 as long as the attributes correspond to the L component specified value of the target battery 100.

For example, if it is possible to set L component specified values within a range in which the L component specified values do not overlap for each vehicle type in the correspondence information, the battery type determination device 400 may be constituted to identify the vehicle type in which the target battery 100 is installed as a regular battery on the basis of the L component measurement value and the L component specified values.

Also, for example, if it is possible to set L component specified values within a range in which the L component specified values do not overlap for each manufacturer in the correspondence information, the battery type determination device 400 may be constituted to identify the manufacturer of the target battery 100 on the basis of the L component measurement value and the L component specified values.

The embodiments described above can be expressed as follows.

A battery type determination device includes: a storage device which stores a program; and
  a hardware processor,
  in which, when the hardware process executes the program stored in the storage device,
  a current application circuit is instructed to apply a specific current to a target battery,
  a voltage response of the target battery with respect to the applied current is measured,
  an inductance value of the target battery is obtained on the basis of a current value applied to the target battery and a voltage value measured as the voltage response, and
  a type of the target battery is determined on the basis of a specified value of an inductance according to a type of the target battery and the obtained inductance value of the target battery.

Although the embodiments in which the present invention was carried out have been described above using the embodiments, the present invention is not limited to these embodiments and various modifications and substitutions can be added without departing from the gist of the present invention.

What is claimed is:

1. A battery type determination device, comprising:
an output controller configured to instruct a current application circuit to apply a specific current to a target battery;
a voltage response measurer configured to measure a voltage response of the target battery with respect to the current applied using the output controller;
a calculator configured to obtain an inductance value of the target battery on a basis of a current value applied using the output controller and on a basis of a voltage value measured by the voltage response measurer; and
a determiner configured to determine a type of the target battery on a basis of a specified value of an inductance according to the type of the target battery and on a basis of an inductance value of the target battery obtained using the calculator.

2. The battery type determination device according to claim 1, wherein the determiner determines whether the target battery is a battery of a type designated in advance on the basis of a specified value of an inductance of a battery of the designated type and the inductance value of the target battery obtained using the calculator.

3. The battery type determination device according to claim 1, wherein the target battery has a winding body of electrodes and separators.

4. The battery type determination device according to claim 3, wherein the target battery includes a plurality of cells having the winding body and terminals of the cells, and
the inductance value changes in accordance with a shape of the electrodes or a shape of the terminals.

5. The battery type determination device according to claim 3, wherein the target battery includes bus bars which connect terminals of a plurality of cells having the winding body, and the inductance value changes in accordance with a shape of the bus bars.

6. A battery type determination method which causes:

a battery type determination device to instruct a current application circuit to apply a specific current to a target battery;

to measure a voltage response of the target battery with respect to the applied current;

to obtain an inductance value of the target battery on a basis of a current value applied to the target battery and on a basis of a voltage value measured as the voltage response; and to determine a type of the target battery on a basis of a specified value of an inductance according to the type of the target battery and on a basis of the obtained inductance value of the target battery.

\* \* \* \* \*